US005596281A

United States Patent [19]

Eriksson

[11] Patent Number: 5,596,281

[45] Date of Patent: Jan. 21, 1997

[54] METHOD AND AN APPARATUS FOR MEASURING THE OUTPUT VOLTAGE ON AN ELECTRIC FENCE AND FOR PRODUCING ELECTRIC PULSES IN SAID FENCE

[75] Inventor: Lars-Arne Eriksson, Sundsvall, Sweden

[73] Assignee: Alfa Laval Agriculture International AB, Tumba, Sweden

[21] Appl. No.: 211,471

[22] PCT Filed: Sep. 25, 1992

[86] PCT No.: PCT/SE92/00669

§ 371 Date: Jun. 20, 1994

§ 102(e) Date: Jun. 20, 1994

[87] PCT Pub. No.: WO93/08671

PCT Pub. Date: Apr. 29, 1993

[30] Foreign Application Priority Data

Oct. 3, 1991 [SE] Sweden ................................ 9102869

[51] Int. Cl.$^6$ .......................... G01R 27/26; G08B 21/00

[52] U.S. Cl. ......................... 324/713; 340/564; 340/660; 324/678

[58] Field of Search .................................. 324/678, 713, 324/509, 510; 340/564, 660, 648; 363/96

[56] References Cited

U.S. PATENT DOCUMENTS

| | | | |
|---|---|---|---|
| 2,981,854 | 4/1961 | Grace et al. | 340/564 |
| 3,987,341 | 10/1976 | Clark | 324/509 |
| 4,028,610 | 6/1977 | Cord'homme | 363/96 |
| 4,096,559 | 6/1978 | Sakurada et al. | 363/96 |
| 4,114,185 | 9/1978 | Gallagher | 340/564 |
| 4,394,720 | 7/1983 | Galson | 363/96 |
| 4,415,850 | 11/1983 | Sherwood | 324/509 |
| 4,523,187 | 6/1985 | Begg | 340/650 |
| 4,581,692 | 4/1986 | Nayberg | 363/96 |
| 4,794,332 | 12/1988 | Schweitzer | 324/509 |
| 4,843,515 | 7/1989 | Richman | 324/509 |
| 4,851,761 | 7/1989 | Matsuno | 324/509 |
| 5,121,317 | 6/1992 | Volger | 363/96 |
| 5,302,945 | 4/1994 | Stoltenberg | 340/564 |

FOREIGN PATENT DOCUMENTS

| | | |
|---|---|---|
| 2323212 | 11/1974 | Germany . |
| 1395498 | 5/1975 | United Kingdom . |

*Primary Examiner*—Maura K. Regan
*Attorney, Agent, or Firm*—Hovey, Williams, Timmons & Collins

[57] ABSTRACT

An electric fence energizing apparatus is described in which a chargeable capacitor is connected to the primary winding of a transformer. The secondary winding of the fence is connected to receive pulses at the discharge of the capacitor, the discharge time serving as a measure of the voltage of the corresponding output pulse on the fence. The primary winding of the transformer is divided into two oppositely connected windings. The capacitor is arranged to be discharged through a first one of the primary windings. A voltage determined by the discharge of the capacitor is produced over the second of the primary windings during the discharge process. A measuring unit measure the time of the duration of this voltage over the second winding determined by the discharge of the capacitor.

6 Claims, 1 Drawing Sheet

METHOD AND AN APPARATUS FOR MEASURING THE OUTPUT VOLTAGE ON AN ELECTRIC FENCE AND FOR PRODUCING ELECTRIC PULSES IN SAID FENCE

BACKGROUND OF THE INVENTION

1. Field of the Invention

The present invention relates to a method for measuring the output voltage on an electric fence and an apparatus for producing electric pulses in said fence, a chargeable discharge capacitor being connected over the primary winding of a transformer, to the secondary winding of which the fence is connected for receiving pulses at the discharge of the capacitor.

2. Discussion of the Prior Art

The voltage of pulses transmitted on a fence must be measured, i.a. because it is required by the provisions for such fences that the voltage is below a predetermined threshold, normally 2 kV.

Earlier this measurement has been done with measuring circuits arranged on the secondary side. However, as the control equipment provided for producing the pulses is located on the primary side of the transformer, this previous technique suffers from some disadvantages. It also involves difficulties to carry out the measurement on the secondary side of the transformer as the voltage is high and currents are low, which makes it difficult to power e.g. a light emitting diode, which requires a comparetivly large current.

OBJECTS AND SUMMARY OF THE INVENTION

The object of the present invention is to provide a method and an apparatus of the kind mentioned by way of introduction, which makes it possible to measure the output voltage of the fence from the primary side.

This object is achieved by the method according to the invention by measuring the discharge time of the discharge capacitor as a measure of the voltage of the corresponding output pulse on the electric fence.

At the apparatus according to the invention this object is achieved in that the primary winding of the transformer is divided into two oppositely connected windings and the discharge capacitor is arranged to be discharged through the first primary winding, a voltage determined by the capacitor charge being generated over the other primary winding during he discharge process, and a measuring unit being arranged to measure the duration time of this voltage, determined by the discharge of the capacitor, over the second primary winding, said time being a measure of the voltage of the output pulse on the fence.

The solution according to the invention is advatageous as a direct measurement on the discharge capacitor would require measurement at a point with a continously high voltage. Due to the large coupling inductance of the transformer there will thus be a high voltage over the first primary winding also when the secondary side is short circuited. At a large load on the fence the output voltage will decrease considerably below the unloaded voltage of the apparatus. In this range of operation the voltage will depend on the resistive load and is thus proportional to the current draw. This results in an output voltage directly related to the corresponding discharge time.

According to one preferable embodiment of the apparatus according to the invention the measuring unit is arranged to measure the length of the time during which one end of the other primary winding has a potential which is distinguishing for the discharge process.

BRIEF DESCRIPTION OF THE DRAWING

An embodiment of the device according to the invention, chosen as an example, will now be described with reference to the enclosed drawing, which shows a circuit diagram of a battery driven apparatus for an electric fence of the kind according to the invention.

DETAILED DESCRIPTION OF THE PREFERRED EMBODIMENTS

Figure 1:
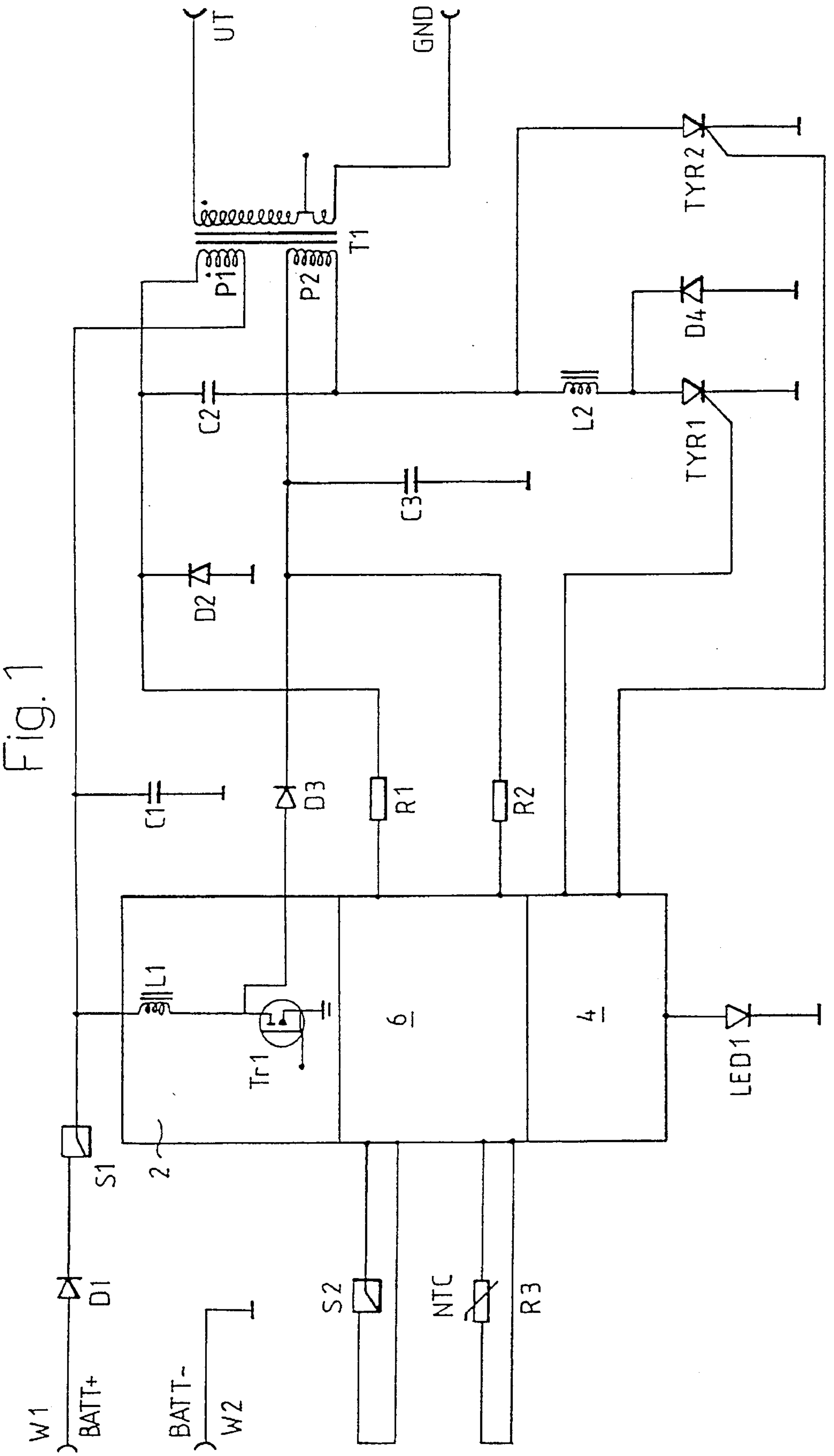

In the battery operated electric fence energiser, shown in FIG. 1, the battery, not shown, is intended to be connected to terminals W1 and W2. S1 is a switch for connecting and disconnecting the battery. The elctric fence apparatus is connected at terminals OUT and GND over the secondary side of a transformer T1. The primary side of the transformer T1 is divided into two windings, coupled in two opposite directions, i.e. an energy recovery winding P1 and a pulse winding P2.

A discharge capacitor C3 is connected over the pulse winding P2. During the charging interval of the capacitor C3 a transistor Tr1 included in a DC—DC converter 2, is controlled by short pulses from a micro processor, not shown, included a control unit 4. This results in a short current from the battery through the transistor Tr1 and an inductance L1, connected in serie with said transistor. When the transistor Tr1 subsequently is cut off a voltage will be produced over the the inductance L1, which results in a current to the capacitor C3 through a diode D3 coupled to the inductance L1. The voltage over the Capacitor C3 will thus increase somewhat for each such current impulse.

The voltage over the capacitor C3 is sensed by a measuring unit 6 over a resistor R2 and when a predetermined maximum voltage has been obtained the charging process is interrupted.

During a subsequent discharge process a thyristor TYR1, connected in serie with the diode D3, the winding P2 and an inductance L2, is ignited from the micro processor in the control unit 4. Normally the micro processor is programmed to ignite the thyristor TYR1 after a predetermined time from the preceding pulse. A current will then start flowing from the capacitor C3 through the winding P2, the inductance L2 and the thyristor TYR1. In this connection the inductance L2 has the function of limiting the increase rate of the current.

After a certain time, when the voltage over the primary side of the transformer T1 has reached its value, the micro processor in the control unit 4 will ignite a thyristor TYR2, connected in parallell with the inductance L2 and the thyristor TYR1, whereby the energy in the capacitor C3 will be drained through the winding P2 of the transformer T1 and the thyristor TYR2.

The pulse through the winding P2 will be stept up by the transformer so as to obtain an output pulse of typically 4–8 kV on the secondary side of the transformer T1, to which the electrical fence is connected.

The operating voltage of the battery is typically in the range 5–9 V and the charging energy amounts to 100–350 mJ. The pulse length is normally 1,4 seconds.

The voltage over the capacitor C3 is continously measured through the resistor R2 for security reasons. If the voltage does not develop in a predescribed manner the charging from the micro processor of the control unit 4 is interrupted.

During the subsequent energy recovery process the side of the energy recovery winding P1 connected to the energy storing capacitor C1 goes positive and a current will flow through the diode D2 and the storing capacitor C1 will be charged, i.e. energy recovered from the fence is restored in the storing capacitor C1. A diode D1 arranged between the terminal W1 and the switch S1 prevents the recovered energy from going into the battery. This is because as soon as the voltage over the capacitor C1 rises over the battery voltage the diode D1 will be blocked. The diode D1 is conveniently a Schottky diode.

The current which is recovered in the energy recovery winding also tends to charge the discharge capacitor C3 negatively. Through a diode D4 connected over the thyristor TYR1 this charge is later discharged through the transformer and is turned to a positive charge in C3 through the inductance of the transformer.

During the subsequent discharge phase for the discharge capacitor C3 the recovery energy stored in the storing capacitor C1 is first consumed, since the diode D1 is blocking as long as the voltage over the capacitor C1 is larger than the battery voltage. Not until the energy of the storing capacitor C1 has been drained so that the voltage has decreased below the battery voltage, current is beginning to be drawn from the battery for charging of the capacitor C3.

Preferably the voltage of the discharge capacitor C3 is measured when the energi of the storing capacitor C1 has been drained, and the remaining voltage over the discharge capacitor C3 is calculated. From this the average current required for reaching the correct capacitor voltage at the end of the discharge period is determined and this average current is drawn from the battery. Such a constant current consumption without heavy current top values is advantagous for the battery.

A switch S2 connected to the measuring unit as shown makes possible switching between two operational modes. One of this, called "training", means that full output voltage is used all the time and is intended to be used during the learning time of the animals. During the other operational mode, called "normal", each full power pulse is followed by a number of pulses of lower power, which reduces the energy consumption and thus increases the lifetime of the battery.

In order for the rise time of the outout pulse not to be too short, e.e. in order not to make the rate of the discharge of the discharge capacitor too high, the transformer T1 is designed to achieve a high coupling inductance. A filter is arranged on the primary side of the transformer, which attenuates high frequency components, above 150 kHz. The filter consists, on the one hand, of the capacitor C2 connected over the windings P1 and P2 of the transformer T1 and the inductance L2 connected between the primary winding P2 and ground, and, on the other hand, of the leakage inductance of the transformer T1. By connecting the capacitor C2 over the two oppositely connected windings P1 and P2, the effect of the capacitor in the filter is reinforced.

To get a large filtering effect, i.e. a long rise time of the pulse and yet low losses, the inductance L2 of the filter is only connected into circuit during the first part of the pulse. During the second part of the pulse the thyristor TYR2 is conducting and is conducts the current past the inductance L2. Otherwise an undesired voltage drop should appear over the inductance L2 due to its resistance, with consequent losses.

At an electric fence of the kind in question provisions often require that an indication is made when the voltage is above a predetermined level, normally 2 kV. Due to this the voltage on the fence must be measured.

As the control unit of the apparatus is located on the primary side of the transformer T1 it is desireable that this voltage measurement can be made from the primary side. It is then not suitable to measure directly on the discharge capacitor as the voltage over the winding P2 is high all the time due to the coupling inductance of the transformer. At a high load the output voltage on the fence will decrease considerably below the unloaded output voltage of the apparatus and in this range of operation the voltage is depending on the resistive load and is thus proportional to the current draw. This implies that the output voltage on the fence is directly related to the discharge time of the capacitor C3.

During pulse transmission the voltage over the first primary winding P2 is transformed to the second primary winding P1. The upper part of the winding P1 will thus have a potential of about +100 Volt during the discharge of the capacitor C3. At the end of the discharge, when the energy recovery process starts as descibed above, the potential at the upper part of the winding P1 will go steeply negative.

With the measuring unit 6 the potential at the upper part of the winding P1 is sensed via a resistance R1 and the time from the start of the discharge process, e.g. the moment when the thyristor TYR1 is ignited, until the potential rapidly starts to decrease, is mesaured by the measuring unit 6 and this time provides a measure of the output voltage.

From the control unit 4 a suitable indicator device e.g. a light emitting diode, can be controlled in dependence of this measured time to indicate that the output voltage is above the predetermined limit according to standards.

I claim:

1. A method for measuring that the output voltage provided to an electric fence from an electric fence apparatus is above a predetermined level, where high voltage pulses are provided to the fence from a secondary winding of a step-up transformer, a chargeable discharge capacitor being connected over a first primary winding of the transformer, the capacitor being charged to a high voltage and being discharged to the first primary winding to generate the high voltage delivered from the secondary winding, the method including the steps:

- measuring the time period for discharge of the capacitor through the first primary winding; and
- calculating the voltage of the corresponding high voltage pulse induced in the secondary winding and provided to the electric fence from the measured time period for discharge of the capacitor.

2. The method as claimed in claim 1, wherein the time period measuring step is made by inducing a voltage in a second primary winding and measuring the time period from a start of the discharge of the capacitor and up to the time, when a potential on one of the terminals of the second primary rapidly starts to decrease.

3. An apparatus for providing electric pulses to an electric fence, comprising:

- a transformer having a first primary winding and a secondary winding, the secondary winding being arranged to be connected to the electric fence;
- a chargeable discharge capacitor connected to the first primary winding;

a charging circuit coupled with the capacitor for charging the capacitor to a high voltage;

a discharge circuit coupled with the capacitor for discharging the capacitor through the first primary winding in order to induce high voltage pulses in the secondary winding;

comprising further a second primary winding of the transformer that is connected oppositely compared to the first primary winding, thus a voltage being induced also in the second primary winding when the capacitor is discharged through the first primary winding; and a measuring unit connected to the second primary winding and arranged to measure the time of duration of a voltage induced in the second primary winding when the capacitor is discharged through the first primary winding, which time provides a measure of the voltage of the voltage induced in the secondary winding which is provided as an output pulse to the electric fence.

4. The apparatus as claimed in claim 3, wherein the measuring unit connected to the second primary winding is arranged to measure the time period from a start of the discharge of the capacitor and up to the time when a potential on one of the terminals of the second primary rapidly starts to decrease.

5. The apparatus of claims 3, further comprising an indicating means controlled by the measuring unit for indicating that the voltage provided to the fence exceeds a predetermined threshold.

6. The apparatus of claim 4, wherein the measuring unit is comprised in a microprocessor and the indicating means comprises a light emitting diode, the supply of voltage to which is controlled by the microprocessor in dependence of the time measured by the measuring unit.

* * * * *